United States Patent
Bains et al.

(10) Patent No.: US 6,785,190 B1
(45) Date of Patent: Aug. 31, 2004

(54) METHOD FOR OPENING PAGES OF MEMORY WITH A SINGLE COMMAND

(75) Inventors: Kuljit S. Bains, Olympia, WA (US); John Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/442,335

(22) Filed: May 20, 2003

(51) Int. Cl.[7] ............................................. G11C 8/00
(52) U.S. Cl. ................................. 365/235; 365/230.03
(58) Field of Search ........................... 365/235, 230.03; 711/103, 105

(56) References Cited

U.S. PATENT DOCUMENTS

| | | | | |
|---|---|---|---|---|
| 5,463,759 A | * | 10/1995 | Ghosh et al. | 711/134 |
| 5,732,241 A | * | 3/1998 | Chan | 711/131 |
| 5,956,743 A | * | 9/1999 | Bruce et al. | 711/103 |

* cited by examiner

*Primary Examiner*—Vu A. Le
(74) *Attorney, Agent, or Firm*—Michael J. Nesheiwat

(57) ABSTRACT

An efficient invention for opening two pages of memory for a DRAM are discussed.

21 Claims, 3 Drawing Sheets

METHOD FOR OPENING PAGES OF MEMORY WITH A SINGLE COMMAND

RELATED APPLICATION

This application is related to application Ser. No. 10/210,908 entitled "A Method to improve Bandwidth on a Cache Data Bus", filed concurrently and assigned to the assignee of the present application. Likewise, this application is related to application Ser. No. 10/442,334 entitled "A HIGH SPEED DRAM CACHE ARCHITECTURE"0 filed previously and assigned to the assignee of the present application.

BACKGROUND

1. Field

The present disclosure pertains to the field of cache memories. More particularly, the present disclosure pertains to a new method for improving command bandwidth and reducing latency for memory access for read and/or write operations.

2. Description of Related Art

Cache memories generally improve memory access speeds in computer or other electronic systems, thereby typically improving overall system performance Increasing either or both of cache size and speed tend to improve system performance, making larger and faster caches generally desirable. However, cache memory is often expensive, and generally costs rise as cache speed and size increase. Therefore, cache memory use typically needs to be balanced with overall system cost.

Traditional cache memories utilize static random access memory (SRAM), a technology which utilizes multi-transistor memory cells. In a traditional configuration of an SRAM cache, a pair of word lines typically activates a subset of the memory cells in the array, which drives the content of these memory cells onto bit lines. The outputs are detected by sense amplifiers. A tag lookup is also performed with a subset of the address bits. If a tag match is found, a way is selected by a way multiplexer (mux) based on the information contained in the tag array.

A DRAM cell is typically much smaller than an SRAM cell, allowing denser arrays of memory and generally having a lower cost per unit. Thus, the use of DRAM memory in a cache may advantageously reduce per bit cache costs. One prior art DRAM cache performs a full hit/miss determination (tag lookup) prior to addressing the memory array. In this DRAM cache, addresses received from a central processing unit (CPU) are looked up in the tag cells. If a hit occurs, a full address is assembled and dispatched to an address queue, and subsequently the entire address is dispatched to the DRAM simultaneously with the assertion of load address signal.

Typically, a processor accesses a plurality of bits in a consecutive manner. For example, a burst operation allows a processor to access a consecutive number of bits based on the burst length. The size ("width") of a bus within a memory needs to increase for accommodating processors that require larger burst lengths, such as, a 16 bit burst length. However, a wider memory bus increases the size of the memory. Thus, the cost of the memory increases. Likewise, a memory that supports only an eight-bit burst length utilizes two memory accesses of eight bits. Thus, the additional penalty in time ("latency") for the additional eight-bit access decreases the processor's performance because the processor is waiting for the completion of the additional eight-bit access. Also, the latency depends on the internal circuit paths of the DRAM.

BRIEF DESCRIPTION OF THE FIGURES

The present invention is illustrated by way of example and not limitation in the Figures of the accompanying drawings.

DETAILED DESCRIPTION

The following description provides methods for reducing latency of a memory access of a memory page and improving command bandwidth. In the following description, numerous specific details are set forth in order to provide a more thorough understanding of the present invention. It will be appreciated, however, by one skilled in the art that the invention may be practiced without such specific details. Those of ordinary skill in the art, with the included descriptions, will be able to implement appropriate logic circuits without undue experimentation.

Various embodiments disclosed may allow a memory such as a DRAM memory to be efficiently used as cache memory. Some embodiments provide particular methods for timing diagrams to efficiently utilize command bandwidth and reduce latency that may be advantageous in particular situations. In one embodiment, the claimed subject matter efficiently utilizes command bandwidth by opening two memory pages in parallel to a TAG lookup with a single command. In contrast, the prior art utilizes two commands to open two memory pages.

The claimed subject matter facilitates efficient read and/or write operations for a memory. For example, in one embodiment, the memory is a DRAM utilized as a cache memory. In one instance, the claimed subject teaches two methods for opening two pages of memory in parallel for a tag lookup.

Figure 1:
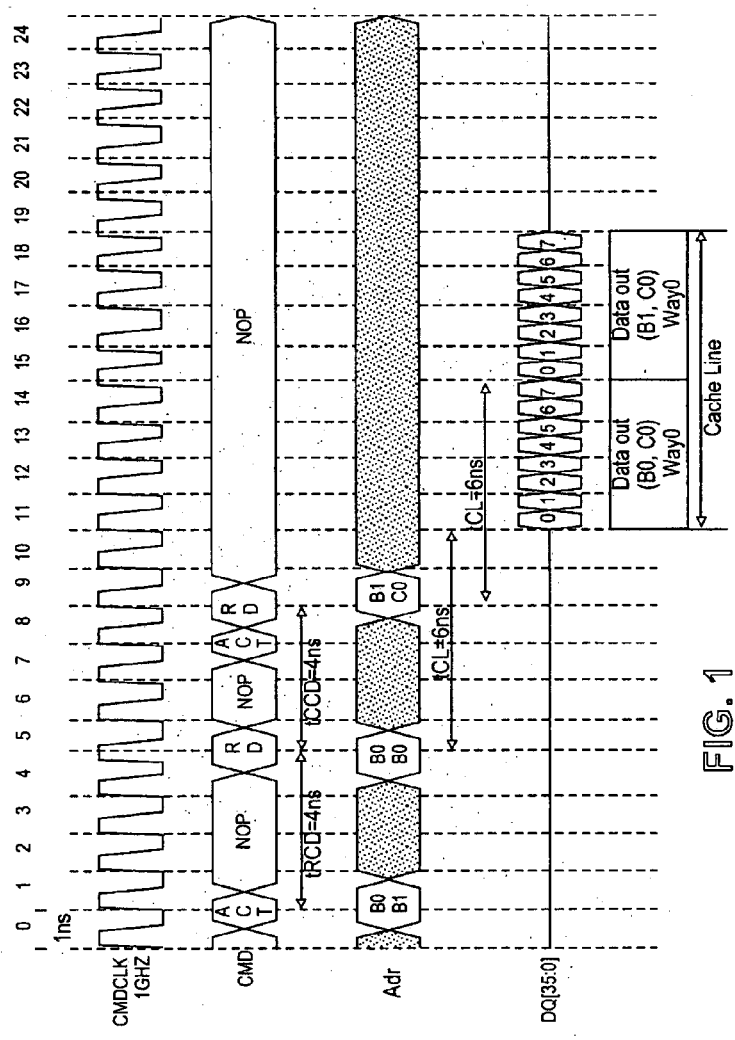
FIG. 1 illustrates a method for a timing diagram for a read of a cache memory according to one embodiment.

In one embodiment, the claimed subject matter describes opening two memory pages in adjacent memory banks in parallel to a tag lookup for a cache line fill operation, which is discussed further in connection with FIG. 1. In another embodiment, the claimed subject matter describes opening two memory pages in different memory bank pairs for a back-to-back cache line fill operation, which is discussed further in connection with FIG. 2. In yet another embodiment, the claimed subject matter supports both of the preceding embodiments.

In another embodiment, the claimed subject matter supports a processor with an integrated TAG RAM. Alternatively, in another embodiment, the claimed subject matter supports a processor that is coupled to an external TAG RAM.

The term DRAM is used loosely in this disclosure, as many modern variants of the traditional DRAM memory are now available. The techniques disclosed and hence the scope of this disclosure and claims are not strictly limited to any specific type of memory, although single transistor, dynamic capacitive memory cells may be used in some embodiments to provide a high density memory array. Various memories arrays which allow piece-wise specification of the ultimate address may benefit from certain disclosed embodiments, regardless of the exact composition of the memory cells, the sense amplifiers, any output latches, and the particular output multiplexers used.

FIG. 1 illustrates a method for a timing diagram for a read of a cache memory according to one embodiment. The timing diagram illustrates a horizontal axis and a vertical axis. The horizontal axis depicts clock cycles, such as, 0, 1, 2, . . . 23, and 24. The vertical axis depict a command clock, CMDCLK, a command instruction, CMD, an Address, ADR, for a read or write, and an output, DQ[35:0]. However, the claimed subject matter is not limited to these pin designations. For example, the claimed subject matter supports different numbers of output pins, such as, DQ[0:15], DQ[63:0], etc., as the memory applications progress or are backward compatible.

First, an "ACT" command instruction in clock cycle 0 initiates the opening of two memory pages in adjacent memory banks. For example, this timing diagram depicts adjacent memory banks 0 and 1. However, the claimed subject matter is not limited to memory banks 0 and 1, rather, memory banks 0 and 1 are just one example of adjacent memory bank pairs.

Next, in one embodiment, a tag lookup operation is initiated during clock cycles 1 and 2. The duration of the tag lookup varies based at least in part on the size of the data cache and TAG Ram. For example, a tag lookup operation is 2 nanoseconds in length for a 64 MB data cache and 2 MB TAG RAM. At the completion of the TAG lookup operation, the processor determines whether there is a cache hit or miss.

However, the claimed subject matter is not limited to 2 ns for a tag lookup. The delay associated with a tag lookup depends on a memory size, the architecture, and implementation.

In the event of a cache hit, a RD command and column address is provided in clock cycle 4, as depicted by RD on the CMD pin and B0 and C0 on the address pins. In this timing diagram example, there is a cache hit to WAY 0 of the DRAM cache memory, wherein the data resides in Bank 0 starting at Column Address 0.

Subsequently, a RD command and column address to Bank 1 is provided in clock cycle 8, as depicted by RD on the CMD pin and B1 and C0 on the address pins.

The output data is illustrated during clock cycles 11–18. Specifically, the data from Bank 0 and column 0 of eight bits occurs during clock cycles 11–14, while the data from Bank 1 and column 0 of eight bits occurs during clock cycles 15–18. In one embodiment, the output data during clock cycles 11–18 is a cache line of the DRAM cache memory, specifically, a cache line for a 16 bit burst length.

Therefore, the claimed subject matter depicts opening Two memory pages of adjacent memory banks, such as, banks 0 and 1, by utilizing only a single ACTIVATE command, depicted as ACT on the command pins. Thus, this saves command bandwidth since only one ACT command was used and reduces memory latency because of only one access to the cache line for a 16 bit burst length.

In contrast, the prior art utilizes two explicit ACT commands. Also, the prior art requires waiting 2 ns before issuing the first ACT command since it is unknown in which bank the critical data resides. Also, issuing two explicit ACT commands would result in a conflict with tRCD and tRRD and requires the ACT command to be delayed one clock cycle.

Thus, FIG. 1 illustrated a method for a timing for a read operation. However, a write operation could also be performed to adjacent memory banks with a single ACT command.

Figure 2:
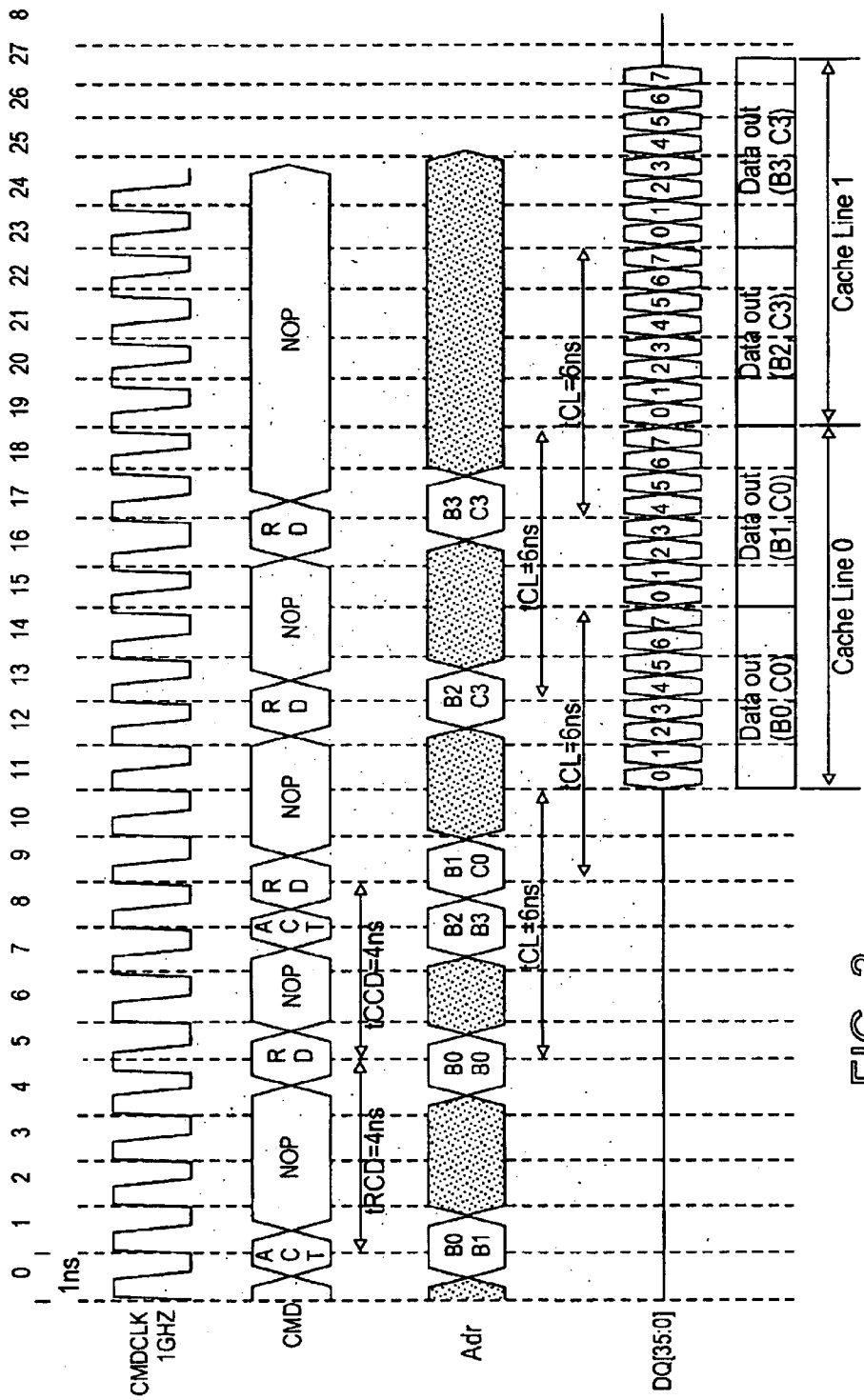
FIG. 2 illustrates a method of a timing diagram for a read of a cache memory according to one embodiment.

FIG. 2 illustrates a method for a timing diagram for a read of a cache memory according to one embodiment. The timing diagram illustrates a horizontal axis and a vertical axis. The horizontal axis depicts clock cycles, such as, 0, 1, 2 . . . . . 23, and 26. The vertical axis depict a command clock, CMDCLK, a command instruction, CMD, an Address, ADR, for a read or write, and an output, DQ[35:0]. However, the claimed subject matter is not limited to these pin designations. For example, the claimed subject matter supports different numbers of output pins, such as, DQ[0:15], DQ[63:0], etc., as the memory applications progress or are backward compatible.

As previously discussed, this embodiment is for back-to-back cache line fill operations from different memory banks. The operation is similar to the previously described operation of FIG. 1 because first cache line fill operation is from bank pair 0–1. However, FIG. 2 allows for back-to-back cache line fill operations because a second ACT command is provided during clock cycle 7 to open memory banks 2 and 3. For example, bank 2 and column 3 are provided on the address pins during clock cycle 12 and bank 3 and column 3 are provided on the address pins during clock cycle 16. The resulting back-to-back cache line fills are depicted during clock cycles 11–26. The first cache line from bank 0 and bank 1 are output on the DQ pins during clock cycles 11–18, while the second cache line from bank 2 and bank 3 are output on the DQ pins during clock cycles 19–26.

Thus, FIG. 2 illustrated a method for a timing for a read operation. However, a write operation could also be performed to adjacent memory banks with a single ACT command.

Figure 3:
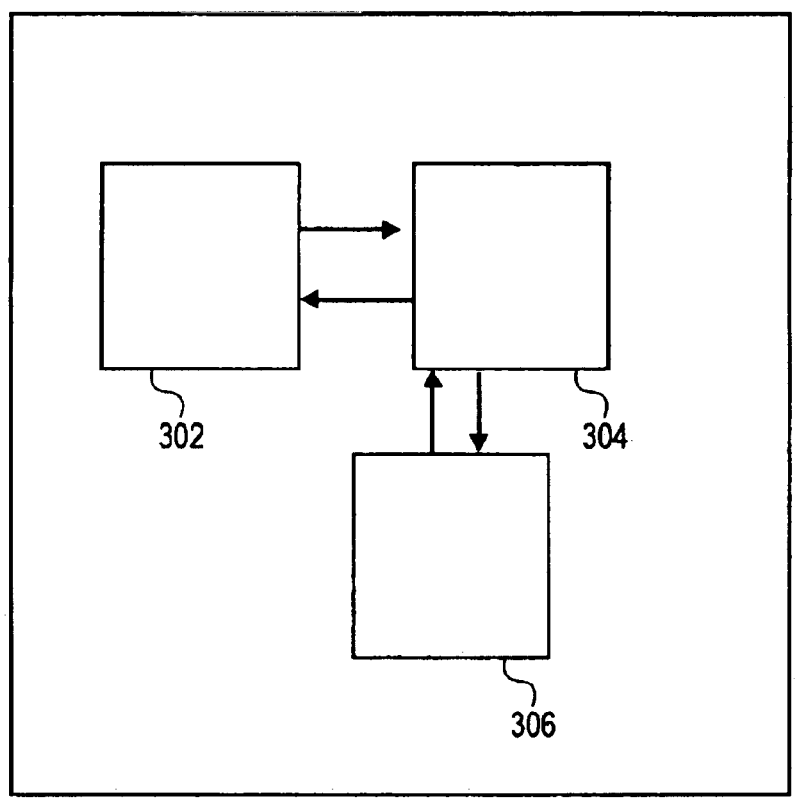
FIG. 3 illustrates an apparatus in accordance with one embodiment.

FIG. 3 depicts an apparatus in accordance with one embodiment. The apparatus in one embodiment is a processor 302 that incorporates a memory controller 304 that is coupled to a DRAM 306. For example, the processor incorporates a memory controller by allowing the processor to perform memory controller functions, thus, the processor performs memory controller functions. In contrast, in another embodiment, the processor 302 is coupled to a memory controller 304 that is coupled to a DRAM 306 and the processor does not perform memory controller functions. In both previous embodiments, the apparatus comprises the previous embodiments depicted in FIGS. 1–2 of the specification. Also, in one embodiment, the apparatus is a system.

Also, the DRAM may be a synchronous DRAM, a double data rate DRAM (DDR DRAM).

Thus, the claimed subject matter for methods and an apparatus for a high speed DRAM architecture are disclosed to improve efficiency for command bandwidth and reduce latency. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A method comprising:

opening a first page of memory in a first memory bank with a single command to the memory;

opening a second page of memory in a second memory bank with the single command to the memory in parallel to the first page based at least in part on the second memory bank being adjacent to the first memory bank.

2. The method of claim 1 wherein opening the first and second page of memory in parallel comprises utilizing the single command of an ACTIVATE (ACT) command.

3. The method of claim 1 wherein opening the first and second page comprises reading the first and second page of memory.

4. The method of claim 1 wherein opening the first and second page comprises writing to the first and second page of memory.

5. The method of claim 3 wherein reading the first and second page comprises outputting a total of sixteen bits from the first and second page of memory on a plurality of output pins, DQ.

6. The method of claim 3 wherein reading the first and second page comprises completing a cache line fill operation.

7. A method comprising:
opening two pages of memory in a first memory bank pair with a first command to the memory for a first cache line fill memory operation;
opening two pages of memory in a second memory bank pair with a second command to the memory for a second cache line fill memory operation; and
completing the second cache line fill memory operations after the first cache line fill memory operation.

8. The method of claim 7 wherein opening the two pages of memory comprises utilizing the first and second command of an ACTIVATE (ACT) command.

9. The method of claim 7 wherein opening the two pages of memory comprises reading the two pages memory.

10. The method of claim 7 wherein opening the two pages of memory comprises writing to the two pages memory.

11. The method of claim 9 wherein reading the two memory pages comprises outputting a total of sixteen bits from each of the first and second memory bank pair on a plurality of output pins, DQ.

12. The method of claim 7 wherein reading the two memory pages from the first and second memory bank pair comprises completing a back-to-back cache line fill operation.

13. An apparatus comprising:
a processor, coupled to a cache memory, the cache memory to open two pages of memory in a first memory bank pair with a first command for a first cache line fill memory operation and to open two pages of memory in a second memory bank pair with a second command for a second cache line fill memory operation; and
the apparatus to complete the second cache line fill memory operations after
the first cache line fill memory operation.

14. The apparatus of claim 13 wherein the two pages of memory are opened in parallel to a tag lookup for a TAG ram that is internal to the processor.

15. The apparatus of claim 13 wherein the two pages of memory are opened in parallel to a tag lookup for a TAG ram that is external to the processor.

16. The apparatus of claim 13 wherein the first and second cache line fill operation are for a back-to-back cache line fill operation for a sixteen bit cache line spread over both banks in the first and second memory bank pair.

17. A memory comprising:
a logic to support a first page of memory in a first memory bank to be opened with a single command to the memory and a second page of memory in a second memory bank to be opened with the single command to the memory in parallel to the first page based at least in part on the second memory bank being adjacent to the first memory bank.

18. The memory of claim 17 wherein the first and second page are opened in parallel to a tag lookup.

19. The memory of claim 17 wherein the memory is a DRAM utilized as a cache memory.

20. A memory comprising:
a logic to support two pages of memory in a first memory bank pair to be opened with a first command to the memory for a first cache line fill memory operation and another two pages of memory in a second memory bank pair to be opened with a second command to the memory for a second cache line fill memory operation; and
the second cache line fill memory operation to be completed after the first cache line fill memory operation.

21. The memory of claim 20 wherein the memory is a DRAM utilized as a cache memory.

* * * * *